(12) United States Patent
Chen

(10) Patent No.: US 6,194,858 B1
(45) Date of Patent: Feb. 27, 2001

(54) SPEED CONTROL DEVICE OF COOLING FANS AND METHOD OF CONTROL THEREOF

(75) Inventor: Hung-Hsiang Chen, Taipei Hsien (TW)

(73) Assignee: Mitac Technology Corp., Hsinchu (TW)

( * ) Notice: Subject to any disclaimer, the term of this patent is extended or adjusted under 35 U.S.C. 154(b) by 0 days.

(21) Appl. No.: 09/352,291

(22) Filed: Jul. 13, 1999

(30) Foreign Application Priority Data

Aug. 26, 1998 (TW) .................................................. 87114118

(51) Int. Cl.[7] ....................................................... G05B 5/00
(52) U.S. Cl. .......................... 318/473; 318/471; 318/445; 388/903; 388/909; 388/934
(58) Field of Search ..................................... 378/473, 471, 378/445; 388/903, 909, 934; 123/41.49

(56) References Cited

U.S. PATENT DOCUMENTS 4,962,734 * 10/1990 Jorgensen ............................... 318/473
5,847,644 * 12/1998 Weisman, II et al. ................ 318/473

\* cited by examiner

*Primary Examiner*—Karen Masih
(74) *Attorney, Agent, or Firm*—Darby & Darby

(57) ABSTRACT

A speed control device for a cooling fan and a method of control thereof are disclosed, in which temperature and noise among other factors are taken into consideration, whereby changes to the voltage/current of power supply provided to the cooling fan are used to adjust the speed of the cooling fan. The speed is reduced as much as possible within the permissible range of system temperature to minimize the noise generated from the cooling fan. When the temperature exceeds the permissible range, the speed of the cooling fan is accelerated to reduce system temperature.

17 Claims, 2 Drawing Sheets

SPEED CONTROL DEVICE OF COOLING FANS AND METHOD OF CONTROL THEREOF

BACKGROUND OF THE INVENTION

1. Field of the Invention

The present invention relates to a cooling technology for a computer system, particularly to a speed control device for a cooling fan and the method of control thereof.

2. Description of the Related Art

Effective cooling has become a major concern in realizing computer system stability for computer operations with increasing clock speed. Currently, a cooling fan, or a fan cooler, is used for rendering cooling effect to a computer system. However, as power management for personal computers (PCs)/notebook computers becomes more diversified and complicated, and the tolerances for noise and temperature more rigid, the conventional two-level operation mode ("ON" or "OFF") for controlling a cooling fan fails to meet demands.

SUMMARY OF THE INVENTION

Consequently, an object of the present invention is to provide a speed control device for cooling fans, capable of changing the speed while keeping a balance between the temperature and the noise level, and applicable to various desktop computers and notebook computers.

To accomplish the above object, the present invention provides a speed control device for cooling fans and a method of control thereof. The method of controlling speed of cooling fans comprises the following steps of: increasing the power supply to a fan and the speed of the cooling fan when the system temperature exceeds a temperature threshold; and decreasing the power supply to a fan and the speed of the cooling fan when the system temperature becomes lower than the temperature threshold.

Further, the present invention also provides a speed control device for cooling fans. The speed control device comprises a current amplifier, an initial current path, and a plurality of weighted current paths. The current amplifier supplies power from a first output terminal to a fan. The weighted current paths are connected in parallel with the initial current path at a second output terminal of the current amplifier, wherein each of the weighted current paths determines its state of being either ON or OFF in accordance with a control signal.

BRIEF DESCRIPTION OF THE DRAWINGS

The aforementioned objects, features and advantages of the present invention will become apparent by referring to the following detailed description of a preferred embodiment with reference to the accompanying drawings, wherein.

DETAILED DESCRIPTION OF THE EMBODIMENTS

Although there are rating voltage/current specifications for general fans, fans can be driven before power supply reaches its rating voltage/current. For example, if the rating voltage for a particular fan is 12V, the fan can be driven at a power supply of about 7–8V. More power is consumed when power supply is increased. The speed can be driven faster to reduce the system temperature, which also leads to increasing noise level. Conversely, less power is consumed when power supply is decreased. When the speed is driven slower, the noise level is reduced. However, the temperature of the system may increase.

Accordingly, the present invention takes advantage of the above characteristics by providing with a speed control device for cooling fans with temperature and noise among other factors taken into consideration, in which changes to the voltage/current of power supply provided to the cooling fan are used to adjust the speed of the cooling fan. The speed is reduced as much as possible in the permissible range of the system temperature to minimize the noise generated from the cooling fan; when the temperature exceeds the admissible range, the speed of the cooling fan is accelerated to reduce system temperature.

Figure 1:
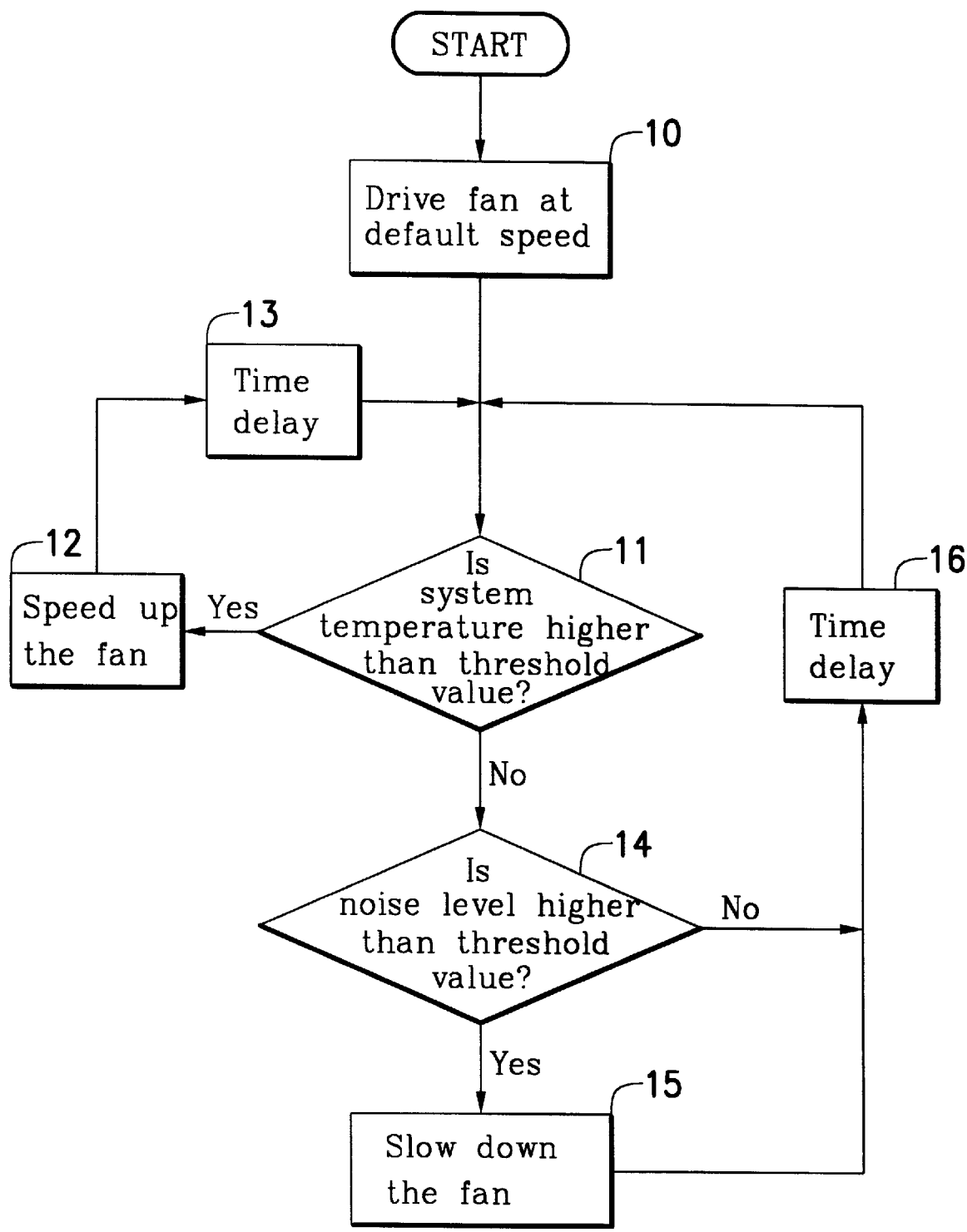
FIG. 1 is a flowchart illustrating the speed control device for cooling fans of the present balancing the temperature and the noise levels.

Referring to FIG. 1, a flowchart illustrating the speed control method for cooling fans of the present invention in accordance with the temperature and the noise levels is illustrated. First, when a computer system is turned on, the cooling fan control device 2 (will be described in the following) drives the fan 1 to operate at the default speed. For example, the default speed of the fan 1 can be adjusted to a speed between a maximal speed and a minimal speed. Next, proceed to Step 11 to determine whether the system temperature has exceeded a temperature threshold. In current computer systems, a temperature detection integrated circuit (such as LM75) is normally implemented to protect the system from overheating. Hence, the determination is based upon the detected temperature by the temperature detection integrated circuit or the like. Here, the temperature threshold is the maximal temperature to keep a computer system in normal operation and can be adjusted whenever necessary. Generally, the system temperature should not exceed 60 degrees Celsius; therefore, the default temperature can be set to 60 degrees.

When the system temperature exceeds the temperature threshold, then proceed to Step 12 to speed up the fan 1 through the cooling fan speed control device 2. Later, after a period of time delay in Step 13, the system temperature is checked again. If the system temperature is higher than the default threshold temperature, then repeat Steps 11, 12, and 13, until the system temperature is lower than the threshold temperature.

If it is known in Step 11 that the system temperature is lower than the temperature threshold, then proceed to Step 14 to determine whether the noise from the cooling fan has exceed a noise threshold. The determination in Step 14 is based upon the noise level of the cooling fan detected by an extra noise detector or by the noise level adjusted by the user with an application program. The noise threshold can be adjusted as required, such as a default setting of 30 dB (decibel).

When the fan noise exceeds the noise threshold, then proceed to Step 15 to slow down the fan 1 through the cooling fan speed control device 2. Later, after a period of time delay in Step 16, resume Step 11 to check the system temperature again. If it is determined in Step 14 that the fan noise is not higher than the default threshold noise, then proceed to Step 16. After a period of time delay, resume Step 11 to check the system temperature again. Further, Step 14 can be skipped and proceed to Step 15 to reduce the speed of the fan 1.

It is known from the steps shown in FIG. 1 that when the system temperature exceeds the temperature threshold, then the speed of the fan 1 is increased to lower the system temperature; when the fan noise exceeds the noise threshold, then the speed of the fan 1 is decreased to reduce the fan noise. Since fan noise only causes annoying distraction to users, and the system temperature actually affects computer system performance, the flowchart of control of FIG. 1 contains criteria of determination based upon system temperature over fan noise.

Figure 2:
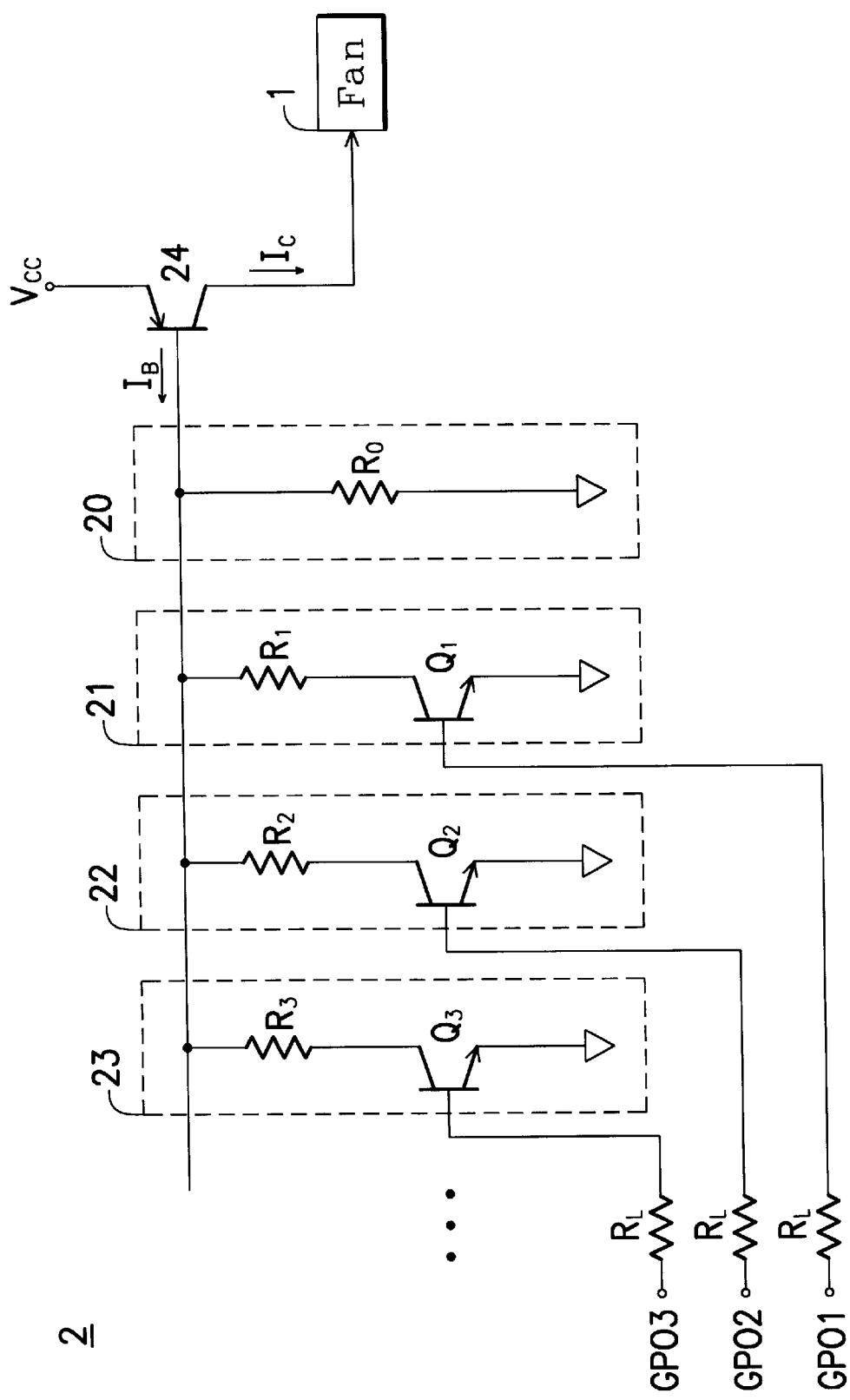
FIG. 2 is a diagram illustrating the circuit of a realized speed control device of one preferred embodiment.

Referring to FIG. 2, a diagram illustrating the circuit of a realized speed control device 2 of one preferred embodiment. In FIG. 2, the speed control device for cooling fans comprises: an initial current path 20, a plurality of weighted current paths 21–23 (three are used in this embodiment, but this should not limit the scope of the present invention), and a PNP bipolar contact transistor 24. The initial current path 20 and the weighted current paths 21–23 are connected in parallel with the base of the transistor 24. The emitter of the PNP transistor 24 is connected to the power supply $V_{CC}$ provided to the fan 1 through the collector $I_C$.

In FIG. 2, the initial current path 20 is formed with a resistor $R_0$, wherein the two ends of said resistor $R_0$ are connected to the base of the transistor 24 and the ground. To illustrate, if the rating voltage/current of the fan 1 is 12V/0.08 A, then the collector current $I_C$ of the transistor 24 is about 70 percent of the rating current, that is, about 0.056 A, when the current at the base $I_B$ is provided by only the initial current path 20. If the current gain β of the transistor 24 is 100, then the current at the base $I_B$ is about 0.56 mA, so the resistor $R_0$ of about 20 KΩ ($R_0$=(12−0.7) V/0.56 mA) can be chosen.

In addition, each of the weighted current paths 21–23 is formed with the resistor and NPN bipolar contact transistor connected in series. For example, the weighted current path 21 is formed with the resistor $R_1$ and the transistor $Q_1$; the weighted current path 22 is formed with the resistor $R_2$ and the transistor $Q_2$; and the weighted current path 23 is formed with the resistor R and the transistor $Q_3$. The connection of the weighted paths 21–23 is determined by the connection of the corresponding transistors $Q_1$–$Q_3$.

To realize speed control of fans in multiple levels between the full rating current and the 70 percent of the rating current, 0.08 A×(100%−70%)/β=0.24 mA and the currents $I_1$–$I_3$ through the weighted current paths 21–23 can be designed in multiples of two. Let $I_1$=0.24 mA/2=0.12 mA $I_2$=0.24 mA/4=0.06 mA $I_3$=0.24 mA/8=0.03 mA Then $R_1$=(12−0.7)V/0.12 mA≈94 KΩ

$R_2$=(12−0.7)V/0.06 mA≈188 KΩ

$R_3$=(12−0.7)V/0.03 mA≈377 KΩ

But at this moment, $(I_1+I_2+I_3)$≈0.24 mA×7/8<0.24 mV, so the above resistor $R_0$ can be compensated by being adjusted to 20 KΩ//$R_3$. The relation table between the logic state of the base control at pins GPO1, GPO2, and GPO3 of the transistors $Q_1$, $Q_2$, and $Q_3$ and the current at the collector $I_C$ of the PNP transistor 24 is as follows.

| GPO1 | GPO2 | GPO3 | $I_c$ (MA) |
|---|---|---|---|
| 0 | 0 | 0 | 59 |
| 0 | 0 | 1 | 62 |
| 0 | 1 | 0 | 65 |
| 0 | 1 | 1 | 68 |
| 1 | 0 | 0 | 71 |
| 1 | 0 | 1 | 74 |
| 1 | 1 | 0 | 77 |
| 1 | 1 | 1 | 80 |

GOP1, GPO2, and GPO3 can be the pins provided in the GPIO interface; the logic states of the GPO1, GPO2, and GPO3 are determined by the BIOS (basic input/output system). A current-limiting resistor $R_L$ is implemented between the pins of GPO1, GPO2, or GPO3 and the respective bases of the transistors $Q_1$, $Q_2$, or $Q_3$. Also, I=71 mA can serve as the current value provided to the fan of default speed in Step 10 of FIG. 1.

Therefore, changing the logic state at pins GPO1, GPO2, GPO3 changes the current $I_C$ supplied to the fan, thereby changing its speed. Steps 11 and 14 as shown in FIG. 1 are then realized.

To summarize, the speed control device for a cooling fan and the method of control thereof in accordance with the present invention can change the speed of fan while maintaining a balance between the temperature and noise levels, and can be applied to various desktop computers and notebook computers.

Although the present invention has been described in its preferred embodiment, it is not intended to limit the invention to the precise embodiment disclosed herein. Those who are skilled in this technology can still make various alterations and modifications without departing from the scope and spirit of the present invention. Therefore, the scope of the present invention shall be defined and protected by the following claims and their equivalents.

What is claimed is:

1. A control method for a cooling fan in a computer system, comprising the steps of:

speeding up said cooling fan by increasing power supplied thereto when said computer system has a system temperature higher than a temperature threshold; and if the system temperature is lower than the temperature threshold and noise generated by the cooling fan is higher than a noise threshold, slowing down said cooling fan by decreasing said power supplied thereto.

2. The method as claimed in claim 1, further comprising the step of driving said cooling fan at a default speed.

3. The method as claimed in claim 1, wherein said system temperature is obtained by a temperature-detecting integrated circuit.

4. A device of controlling speed of a cooling fan comprising:

a current amplifier for supplying power from a first output terminal to said cooling fan;

an initial current path;

a plurality of weighted current paths connected in parallel to said initial current path at a second output terminal of said current amplifier, wherein each of said weighted current paths determines an ON/OFF status in response to a control signal.

5. The device as claimed in claim 4, wherein each of said weighted current paths comprises:

a resistor with one end connected to said second output terminal of said current amplifier; and an NPN transistor with a collector connected to another end of said resistor, a base coupled to said control signal, and an emitter connected to ground.

6. The device as claimed in claim 5, wherein resistance of said resistor is a multiple of two.

7. The device as claimed in claim 4, wherein said current amplifier is a PNP transistor, a collector of said PNP transistor being said first output terminal, a base of said PNP transistor being said second output terminal, and an emitter of said PNP transistor being connected to a voltage source.

8. The device as claimed in claim 4, wherein said initial current path comprises a resistor connected between said second output terminal and ground.

9. A control method for a cooling fan in a computer system, comprising the steps of:
    (a) driving the cooling fan at a default speed;
    (b) determining whether a system temperature of the computer system has exceeded a temperature threshold;
    (c) speeding up the cooling fan if the system temperature is higher than the temperature threshold;
    (d) allowing a period of time delay to pass after step (c);
    (e) repeating steps (b), (c) and (d) until the system temperature is lower than the threshold temperature;
    (f) determining if fan noise from the cooling fan has exceeded a noise threshold; and
    (g) slowing down the cooling fan if the fan noise exceeds the noise threshold.

10. The method of claim 9 further comprising the steps of:
    (h) allowing a second period of time delay to pass after step (f); and
    (i) repeating steps (b), (c), (d), (e), (f), (g) and (h).

11. The method of claim 9 further comprising the step of adjusting the default speed between a maximal speed and a minimal speed.

12. The method of claim 9 further comprising the step of adjusting the temperature threshold.

13. The method of claim 9 further comprising the step of adjusting the noise threshold.

14. A device for controlling speed of a cooling fan in a computer system, comprising:
    means for driving the cooling fan at a default speed;
    means for determining whether a system temperature of the computer system has exceeded a temperature threshold;
    means for speeding up the cooling fan if the system temperature is higher than the temperature threshold;
    means for determining if fan noise from the cooling fan has exceeded a noise threshold; and
    means for slowing down the cooling fan if the fan noise exceeds the noise threshold.

15. The device of claim 14 further comprising means for adjusting the default speed between a maximal speed and a minimal speed.

16. The device of claim 14 further comprising means for adjusting the temperature threshold.

17. The device of claim 14 further comprising means for adjusting the noise threshold.

* * * * *